United States Patent [19]

Ezoe et al.

[11] 4,013,951
[45] Mar. 22, 1977

[54] CIRCUIT TESTING APPARATUS

[75] Inventors: Mitsuhiko Ezoe; Hiroshige Ozawa, both of Yokohama, Japan

[73] Assignee: Nissan Motor Co., Ltd., Japan

[22] Filed: July 31, 1975

[21] Appl. No.: 600,587

[30] Foreign Application Priority Data

Aug. 2, 1974 Japan .............................. 49-88711
Sept. 17, 1974 Japan ............................. 49-106942

[52] U.S. Cl. ........................................... 324/73 R
[51] Int. Cl.² ....................................... G01R 15/12
[58] Field of Search ........ 324/73 R, 73 PC, 73 AT; 235/153 AC

[56] References Cited

UNITED STATES PATENTS

| | | | |
|---|---|---|---|
| 3,219,927 | 11/1965 | Topp, Jr. et al. ..................... | 324/73 |
| 3,784,907 | 1/1974 | Eichelberger .................. | 324/57 DE |
| 3,883,801 | 5/1975 | Hess ................................ | 324/73 R |
| 3,916,306 | 10/1975 | Patti ............................... | 324/73 R |

*Primary Examiner*—R. V. Rolinec
*Assistant Examiner*—Vincent J. Sunderdick
*Attorney, Agent, or Firm*—Robert E. Burns; Emmanuel J. Lobato; Bruce L. Adams

[57] ABSTRACT

Circuit testing apparatus includes a pulse oscillator providing clock pulses, a binary counter for counting the clock pulses to successively generate binary numbers, and a translator which translates the successive binary numbers into a series of test patterns. The test patterns include a series of input bit patterns used to energize the input leads of an electronic logic circuit under test and a series of output binary digits, each of which corresponds to the respective one of the input patterns. Each of the binary digits is compared with an output from the logic circuit under test. When the circuit tested is not functioning as prescribed for a particular set of input pattern, a noncoincidence signal will be produced to disable the binary counter in order to permit the test operator to register the test mode in which the trouble occurred. The binary counter may be enabled manually after registration to complete the prescribed number of tests. The presence of a noncoincidence signal is represented by binary digits and stored in a shift register. The stored bits are translated into information indicating the location of a circuit trouble, if any.

8 Claims, 2 Drawing Figures

TABLE I

| MODE NO | BINARY COUNTER OUTPUT | | | TRANSLATOR OUTPUT TERMINALS | | | |
|---|---|---|---|---|---|---|---|
| | | | | 22 | 21 | 20 | 23 |
| 1 | 0 | 0 | 1 | 1 | 0 | 0 | 0 |
| 2 | 0 | 1 | 0 | 0 | 0 | 0 | 0 |
| 3 | 0 | 1 | 1 | 0 | 0 | 1 | 1 |
| 4 | 1 | 0 | 0 | 0 | 0 | 1 | 1 |
| 5 | 1 | 0 | 1 | 1 | 1 | 0 | 0 |
| END OF TEST | 1 | 1 | 0 | | | | |

CIRCUIT TESTING APPARATUS

BACKGROUND OF THE INVENTION

The present invention relates to apparatus for testing electrical circuits, and specifically to apparatus for applying a series of tests to electronic logic circuitry to check for any erroneous circuit action and to indicate the location of possible circuit troubles.

The recent widespread use in the automotive industry of electronics technology requires testing of electronic logic circuitry used in automobiles in an efficient manner, not only in the manufacturing stage, but also in the after-care servicing. Since electronic circuit components employed in automobiles are subject to rigorous environment and the failure of any circuit component could endanger the life of a vehicle occupant, it is important that such circuitry be tested frequently when in use to check for any trouble in advance. To permit frequent application of tests the testing apparatus should be efficient, compact in size and easy to operate.

SUMMARY OF THE INVENTION

An object of the invention is therefore to provide apparatus for testing an electronic logic circuit in sequence by applying a series of different input patterns to the circuit under test and checking the output from the circuit against a prescribed output pattern.

Another object of the invention is to provide testing apparatus in which the sequence of test results is represented by a combination of binary digits and the location of faulty parts in the circuit is indicated to facilitate troubleshooting.

According to one aspect of the invention, a circuit under test is subjected to a series of test patterns generated by a pattern generator which also generates a prescribed output pattern which is compared with the actual output from the circuit being tested. The result of the comparison is used to shift the patterns to the next step when the circuit is properly functioning for a particular set of input conditions and hold the pattern for a while when a malfunction is detected to allow the test operator to register the trouble. When a series of a predetermined number of tests has been completed, an end-of-test signal is produced to activate a "GO" indicator to draw the attention of the operator to replace the circuit with another circuit to be tested.

In another aspect of the invention, the test result for each pattern is stored in a shift register which is coupled to a translator in which the series of test results is translated into information indicative of the location of a circuit trouble, if any.

BRIEF DESCRIPTION OF THE DRAWINGS

These and other objects and features of the present invention will become apparent from the following description taken in conjunction with the accompanying drawings, in which.

DESCRIPTION OF THE PREFERRED EMBODIMENT

Figure 1A:
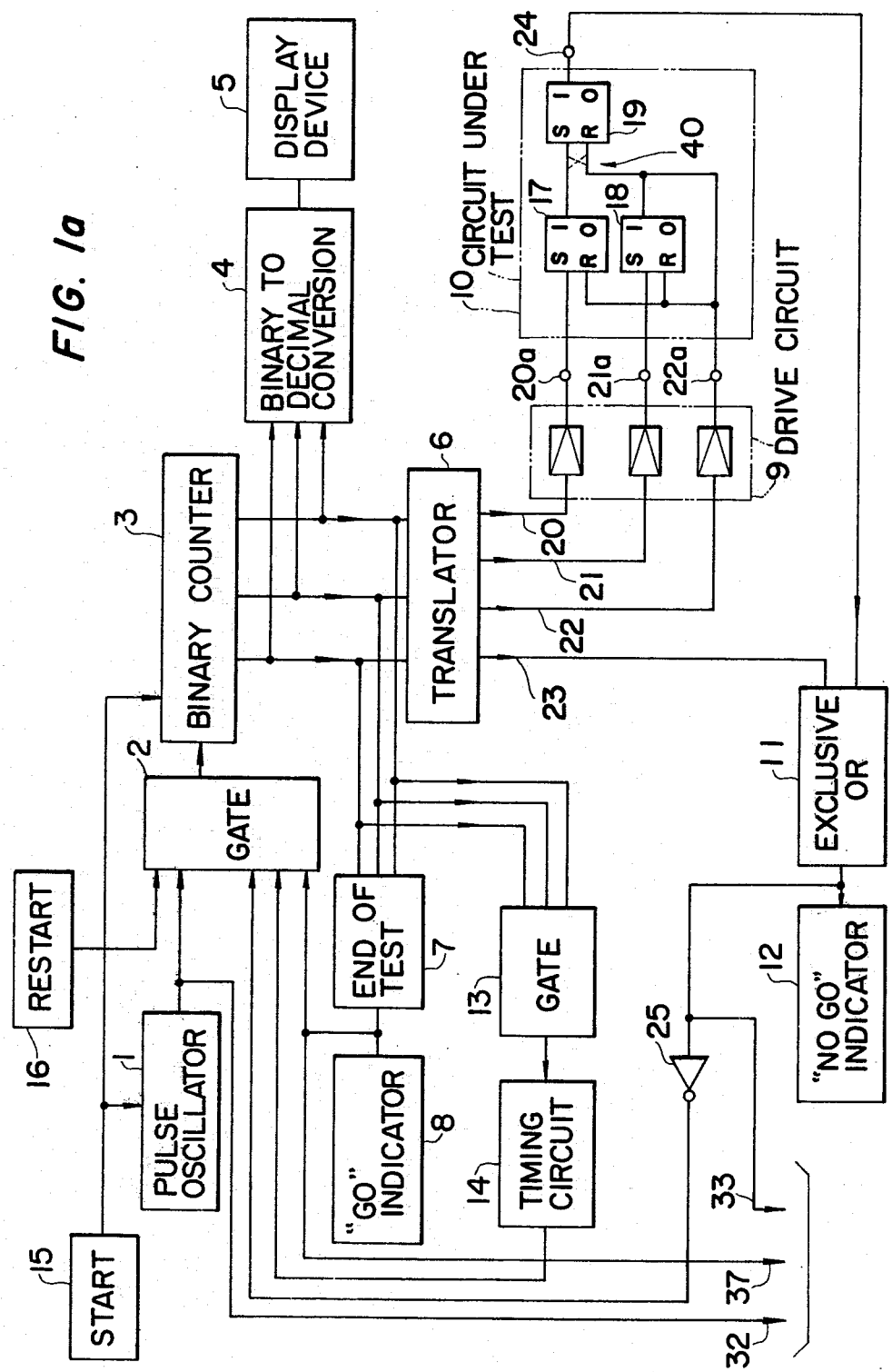
FIG. 1a is a section of a circuit diagram which serves the function of generating a series of test patterns, checking the output from a circuit under test which has received the test patterns against a prescribed output pattern, and indicating the mode of test for any particular pattern when a circuit malfunction occurs.

Referring now to FIG. 1a, there is shown an embodiment of the invention. Numeral 1 indicates a pulse oscillator which generates a train of pulses occurring at a constant interval, the pulses being applied to a binary counter 3 through a gate circuit 2. The binary counter 3 counts the input pulses and delivers its output in binary representation to a memory circuit or translator 6 which translates the binary count into a suitable signal format for a particular test item in accordance with the information stored therein and energizes a drive circuit 9 through parallel leads 20, 21 and 22. A binary-to-decimal converter 4 is coupled to the output of binary counter 3 to convert the binary-represented code into a decimal number to be displayed on a display device 5 in order to indicate the mode of test being applied to an electrical circuit 10 under test. Also coupled to the output of binary counter 3 is an end-of-test circuit or gate 7 which provides an output when a series of tests has completed. Numeral 8 is a device used to indicate that the test circuit functions properly and has thus passed the tests.

The drive circuit 9 may comprise relay circuits or any other amplifying elements to amplify the signal to a level sufficient to drive the tested circuit 10. The circuit 10 to be tested may be of the type which comprises logic circuitry including a plurality of logical input and output means. One example of circuit 10 is shown comprising flip-flops 17, 18 and 19 with three input leads or terminals 20a, 21a, and 22a and a signal output lead or terminal 24. With a particular set of input conditions, the tested circuit 10 provides an output which is coupled to the input of an exclusive-OR gate 11 to which is also applied an output from the translator 6 over lead 23. The output signal on lead 23 indicates the desired output conditions of the circuit 10 which correspond to the particular set of input conditions and is a standard sequence of output pulse patterns corresponding to a sequence of output pulse patterns which would be developed by a circuit to be tested in response to the test pulse patterns applied over lads 20–22, if the circuit to be tested operates error free. The exclusive-OR gate 11 compares the output from circuit 10 with the translator output on lead 23 and provides an output when the former does not coincides with the latter. When there is not coincidence between the two outputs, the circuit 10 is not properly functioning for a particular set of input conditions and exclusive-OR gate 11 provides a high level output to a "NO-GO" indicator 12 and provides a low level signal to gate circuit 2 by way of an inverter 25 to inhibit the supply of pulses from the oscillator 1 to the binary counter 3. Therefore, upon the occurrence of an error in the function of the circuit 10 under test the binary counter 3 ceases its counting operation and the decimal number indicating the mode of test under which the circuit 10 fails to preform the prescribed logic operation is indicated on the device 5.

The actual operation of the circuit of FIG. 1a is commenced first with connecting the input and output leads of a circuit 10 to be tested to the corresponding output leads from the drive circuit 9 and the input to exclusive-OR gate 11, respectively. The translator 6 is provided with prescribed sets of input conditions as indicated in Table 1 for a particular sequence of test modes or items represented by the binary counter output. A start switch 15 is then activated to generate pulses from the oscillator 1 and reset the binary counter 3. The pulses are gated through gate circuit 2 and applied to the binary counter 3 which provides a binary output on its parallel leads to the translator 6. In mode No. 1 the counter 3 provides a binary output "001" which is translated into "100" and applied as an input to the driver circuit 9 and transferred to the circuit 10 which in turn operates in accordance with its logic and provides a low level output on lead 24 which is checked against the translator output on lead 23, which in this mode is "0". Exclusive-OR gate 11 provides a low level signal which is inverted to enable the gate 2 to pass the subsequent pulse from oscillator 1 to the binary counter 3 which updates its count to "010," thus shifting the test mode to mode No. 2. The binary output is translated into "010" which turns on flip-flop 18 of circuit 10 which applies a high level output to the reset terminal of flip-flop 19. Circuit 10 thus provides a low level output which is checked against the translator output in mode No. 2, i.e., "0." In mode No. 3, the translator 6 provides "011" output which simultaneously turns on flip-flops 17 and 18 and turns on flip-flop 19. A high level output will be delivered from the circuit 10 and checked against the translator output of "1." These processes will be repeated so far as the circuit under test functions properly as prescribed until the counter 3 produces "110" which is passed through the end-of-test gate 7 and applied to the "GO" indicator 8 to indicate that the circuit 10 has passed the series of tests in modes No. 1 to No. 5. When the circuit 10 is not properly functioning for a particular set of input conditions, the exclusive-OR gate 11 provides a high level output to energize the "No GO" indicator 12 and inhibit the gate 2 to stop the test at the mode in which faulty operation has been found. The circuit 10 under test is then removed from the circuit and transferred for pinpoint analysis to locate the trouble.

If the logic sequence of circuit 10 contains a timing operation, it is preferable to include a timing circuit 14 which is coupled to the output of logic gate 13 in order to prevent the binary counter 3 from going to the next step for a predetermined interval. The logic gate 13 is coupled to the output of binary counter 3 and provides an output in response to a prescribed set of input conditions in which the timing operation as referred to above occurs in the circuit 10 under test. The timing circuit 14 normally provides a high level output to the gate 2 and changes its output level when it receives an output from the gate 13.

The circuit of FIG. 1a is provided with a restart switch 16 which may advantageously be used to apply subsequent tests when the counter 3 is stopped at a mode in which faulty operation is found in the circuit under test during the course of the functional tests. The restart switch 16, when activated, enables the gate 2 and allows subsequent clock pulses to be applied to the counter 3.

Figure 1B:
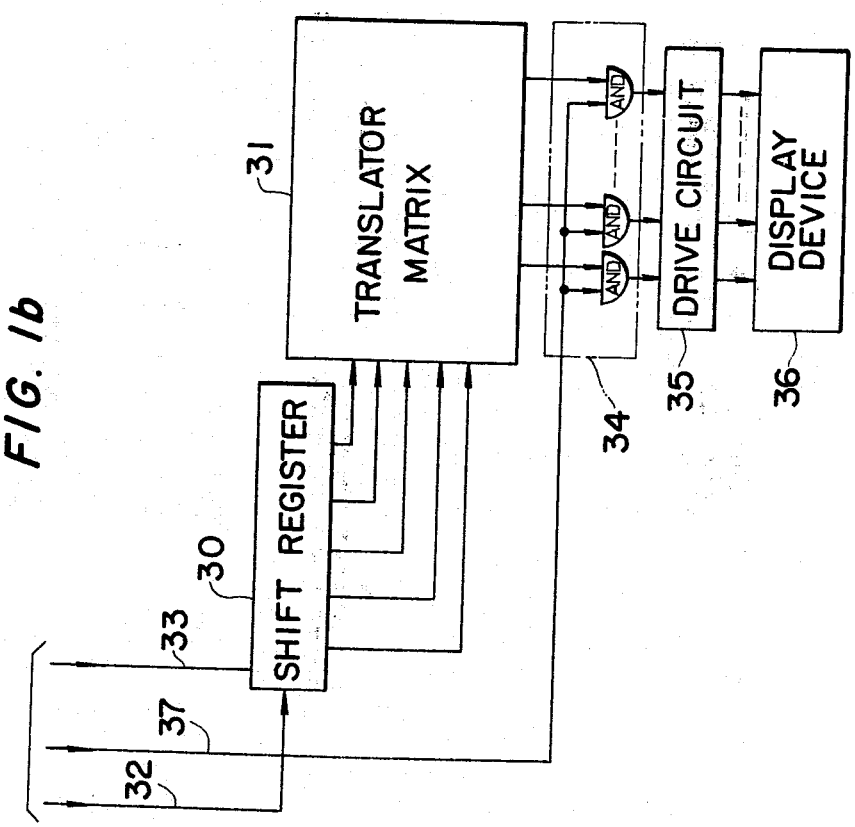
FIG. 1b is another section of the circuit diagram of the invention to indicate the location of any circuit trouble by translating the series of test results in accordance with stored information; and Table 1 shows modes of different tests to be applied to an exemplary circuit with a set of test patterns in the form of binary digits.

To facilitate the test operator to identify the faulty location in a defective circuit 10, a circuit shown in FIG. 1b is coupled to the circuit shown in FIG. 1a. In FIG. 1b, a shift register 30 has its row of storage elements coupled to a translator matrix 31 over five parallel leads. The shift register 30 has its clock input coupled to the output of pulse oscillator 1 on lead 32 and its setting and resetting input coupled to the output of exclusive-OR gate 11 on lead 33. Since there are five modes of tests for a particular circuit under test, there are $2^5$ combinations of possible faulty operation. With the circuit so arranged, the result of the tests as represented by the presence or absence of the output from exclusive-OR gate 11 is stored as a binary digit in the row of five storage elements. The possible faulty combinations are thus represented by the "1" or "0" output on the parallel leads from the register 30 and translated by the matrix 31 into the location of faulty parts or connections. The translator 31 may comprise a diode or resistor network in the form of an input-to-output matrix which translates the set of 32 input combinations into respective information indicative of faulty components in the form of binary digits which are transferred by way of AND gate network 34 when an end-of-test signal is delivered from end-of-test gate 7 over lead 37. The transferred binary signal is amplified by a drive circuit 35 and applied to a display device 36.

Assuming that a faulty reverse connection is present in the circuit 10 under test as indicated at 40, the circuit 10 will produce a series of "11111" output through the modes No. 1 to No. 5 and as a result the exclusive-OR gate 11 will in turn produce a series of "11001" digits which are stored in the shift register 30 and transferred to the translator 31. The translator 31 recognizes this as the presence of a faulty connection in the input circuit to the flip-flop 19 of the circuit under test.

Whenever noncoincidence between the inputs to the exclusive-OR gate 11 occurs, the "NO GO" indicator 12 is activated to demand the test operator to press the restart switch 16 to continue the sequence of tests, since the pulses from the oscillator 1 are inhibited. However, it can be arranged to proceed with the tests without interruption even when the noncoincidence occurs during the course of tests by disconnecting the circuit interconnecting the output of exclusive-OR gate 11 and an input to the gate circuit 2, if the information displayed on the device 36 is automatically recorded on a suitable medium.

At the end of a series of tests, an end-of-test signal issues from the end-of-test gate or logic 7 and a "GO" signal will be provided by the indicator 8 to alert the operator to replace the circuit 10 with another circuit to be tested.

In the foregoing description, the circuit 10 under test has been described as having a single output lead. However, a circuit having a plurality of output leads may be employed. In such instance, the translator 6 is designed to generate a series of output bit patterns, each of which corresponds to each of the input bit patterns.

Various modifications are apparent to those skilled in the art without departing from the scope of the present invention which is only limited by the appended claims. Therefore, the embodiments shown and described are only illustrative, not restrictive.

What is claimed is:

1. Apparatus for automatically applying a series of tests to an electrical circuit and indicating the result of the tests, comprising:
    pattern generating means for generating a sequence of test pulse patterns and applying the same to a circuit to be tested and for generating a standard sequence of output pulse patterns corresponding to a sequence of output pulse patterns which would be developed by the circuit to be tested in response to the applied test pulse patterns if the circuit to be tested operates error free, said pattern generating means generating the test pulse patterns at respective intervals corresponding to intervals required by the circuit to be tested to develop output pulse patterns in response to respective ones of the test pulse patterns applied to the circuit to be tested;

means for comparing a sequence of output pulse patterns developed by the circuit to be tested with the standard sequence of output pulse patterns to check for noncoincidence between the output pulse patterns developed in response to a test pulse pattern and corresponding pulse patterns of the standard sequence of output pulse patterns; indicating means for indicating the result of the comparison; and means for disabling said pattern generating means upon the occurrence of said noncoincidence.

2. Apparatus as set forth in claim 1, further comprising means operable for enabling said pattern generating means to resume its operation after it has been disabled when said noncoincidence has occurred.

3. Apparatus for automatically applying a series of tests to an electrical circuit of the type having a timing mode of operation and having a plurality of input terminals and an output terminal, and for indicating the result of the test, comprising:

a binary counter for counting pulses and for developing a binary output representative of the number of counted pulses;

a pulse generator supplying said counter with clock pulses;

gate means connected between the counter and the generator to control the supply of said clock pulses;

a translator coupled to the output of said binary counter for translating the binary output thereof into a series of test pulse patterns, each being comprised of a pattern of parallel binary pulses corresponding to respective input terminals of a circuit under test, and output binary information comprised of a series of pulses corresponding to the output of the circuit under test developed in response to the series of test pulse patterns;

an exclusive-OR gate coupled to the output of said circuit under test for checking the binary state of the output of said circuit under test against said output binary information to develop an output when there is noncoincidence therebetween, the output thereof being connected to said gate means for disabling said gate means and preventing the supply of the clock pulses when the noncoincidence occurs;

a logic gate connected to the output of said binary counter to provide an output when a predetermined count is reached therein corresponding to the particular input bit pattern which operates the circuit under test in a timing mode of operation;

a timing circuit responsive to the output from said logic gate to provide an inhibit signal to said gate means to interrupt the supply of said clock pulses to said binary counter for a predetermined period for which the circuit under test operates in the timing mode of operation;

means for detecting the end of a series of said tests to prevent the supply of the clock pulses to the binary counter after the series of tests is complete; and indicating means connected to the output of said exclusive-OR gate for indicating said noncoincidence.

4. Apparatus as set forth in claim 3, further comprising a shift register receptive of the clock pulses and an output from the exclusive-OR gate to be shifted by the clock pulses to generate a set of different output patterns each representing the occurrence of the noncoincidence, a second translator coupled to the shift register and having a set of stored information for translating said output patterns from the shift register into a form indicating the location of a trouble in said electrical circuit, means for indicating said location in intelligible form and a circuit connecting the output from said second translator to said location indicating means upon the detection of the end of the series of tests.

5. Apparatus as set forth in claim 3, further comprising means for inhibiting said gate means for a predetermined duration in response to a particular count in said binary counter.

6. Apparatus as set forth in claim 5, wherein said inhibiting means comprises a logic gate coupled to the binary counter to provide an output in response to said particular count and a timing circuit responsive to the output from the logic gate for providing an output to said gate means.

7. Apparatus as set forth in claim 3, further comprising means for indicating the sequence of said tests including a binary-to-decimal converter for converting the binary output of said binary counter into a decimal representation, and a display device coupled to said converter for displaying a decimal number sequence representative of the sequence of test pulse patterns applied to the circuit under test.

8. Apparatus as claimed in claim 3, wherein said indicating means comprises a shift register of the clock pulses and the output from said exclusive-OR gate to be shifted therealong in step with the clock pulses to provide a pattern of output bits in parallel format, a second translator receptive of said parallel output bits from said shift register and having a set of stored information for checking it against said output bits from the shift register to generate an output indicating the characteristic of a trouble in the electrical circuit under test, and means for displaying the characteristic of the trouble.

* * * * *